(12) United States Patent
Murrell et al.

(10) Patent No.: US 7,586,101 B2
(45) Date of Patent: *Sep. 8, 2009

(54) ION SOURCES FOR ION IMPLANTATION APPARATUS

(75) Inventors: Adrian John Murrell, Horsham (GB); Richard David Goldberg, Hove (GB); Christopher J. S. Burgess, Hove (GB); David George Armour, Turton (GB); Erik J. H. Collart, Ashington (GB)

(73) Assignee: Applied Materials, Inc., Santa Clara, CA (US)

( * ) Notice: Subject to any disclaimer, the term of this patent is extended or adjusted under 35 U.S.C. 154(b) by 960 days.

This patent is subject to a terminal disclaimer.

(21) Appl. No.: 11/018,857

(22) Filed: Dec. 22, 2004

(65) Prior Publication Data

US 2008/0129180 A1    Jun. 5, 2008

Related U.S. Application Data

(63) Continuation of application No. 10/334,136, filed on Dec. 31, 2002, now Pat. No. 6,847,043.

(30) Foreign Application Priority Data

Dec. 31, 2002    (GB) ................. 0131097.8

(51) Int. Cl.
```
H01J 27/14     (2006.01)
H01J 37/08     (2006.01)
H01J 37/317    (2006.01)
H01J 1/20      (2006.01)
H01J 27/20     (2006.01)
```
(52) U.S. Cl. ............ 250/426; 250/427; 250/423 R; 250/492.21; 315/111.81; 313/270; 313/46; 313/47

(58) Field of Classification Search ........... 250/426, 250/427, 423 R, 492.21; 315/111.81; 313/46, 313/47, 270
See application file for complete search history.

(56) References Cited

U.S. PATENT DOCUMENTS 3,569,768 A    3/1971 Brenda (Continued)

FOREIGN PATENT DOCUMENTS

EP    0282467    9/1988

(Continued)

OTHER PUBLICATIONS

English Abstract of JP 2001167707.

(Continued)

Primary Examiner—Jack I Berman
(74) Attorney, Agent, or Firm—Boult Wade Tennant

(57) ABSTRACT

The invention relates to improving the efficiency of ion flow from an ion source, by reducing heat loss from the source both in the ion chamber of the ion source and its constituent parts (e.g. the electron source). This is achieved by lining the interior of the ion chamber and/or the exterior with heat reflective and/or heat insulating material and by formation of an indirectly heated cathode tube such that heat transfer along the tube and away from the ion chamber is restricted by the formation of slits in the tube. Efficiency of the ion source is further enhanced by impregnating and/or coating the front plate of the ion chamber with a material which comprises an element or compound thereof, the ions of which element are the same specie as those to be implanted into the substrate from the source thereof.

15 Claims, 7 Drawing Sheets

U.S. PATENT DOCUMENTS

| | | | |
|---|---|---|---|
| 3,881,124 A | 4/1975 | Buescher et al. | |
| 4,383,177 A | 5/1983 | Keller et al. | |
| 4,529,571 A | 7/1985 | Bacon et al. | |
| 4,554,479 A | 11/1985 | Opresko | |
| 4,558,254 A | 12/1985 | Opresko | |
| 4,847,476 A | 7/1989 | Sato et al. | |
| 5,198,677 A | 3/1993 | Leung et al. | |
| 5,554,852 A | 9/1996 | Bright et al. | |
| 5,883,391 A | 3/1999 | Adibi et al. | |
| 5,886,355 A | 3/1999 | Bright et al. | |
| 5,920,076 A | 7/1999 | Burgin et al. | |
| 5,977,552 A | 11/1999 | Foad | |
| 6,239,440 B1 | 5/2001 | Abbott | |
| 6,847,043 B2 * | 1/2005 | Murrell et al. | 250/426 |

FOREIGN PATENT DOCUMENTS

| | | |
|---|---|---|
| EP | 0851453 | 7/1998 |
| EP | 1126493 | 8/2001 |
| GB | 2295268 | 5/1996 |
| JP | 58102440 | 6/1983 |
| JP | 4133251 | 5/1992 |
| JP | 9161704 | 6/1997 |
| JP | 10283976 | 10/1998 |
| JP | 2001312974 | 11/2000 |
| JP | 2001167707 | 6/2001 |

OTHER PUBLICATIONS

English Abstract of JP 9161704.
English Abstract of JP 2001312974.
English Abstract of JP 10283976.
English Abstract of JP 4133251.

* cited by examiner

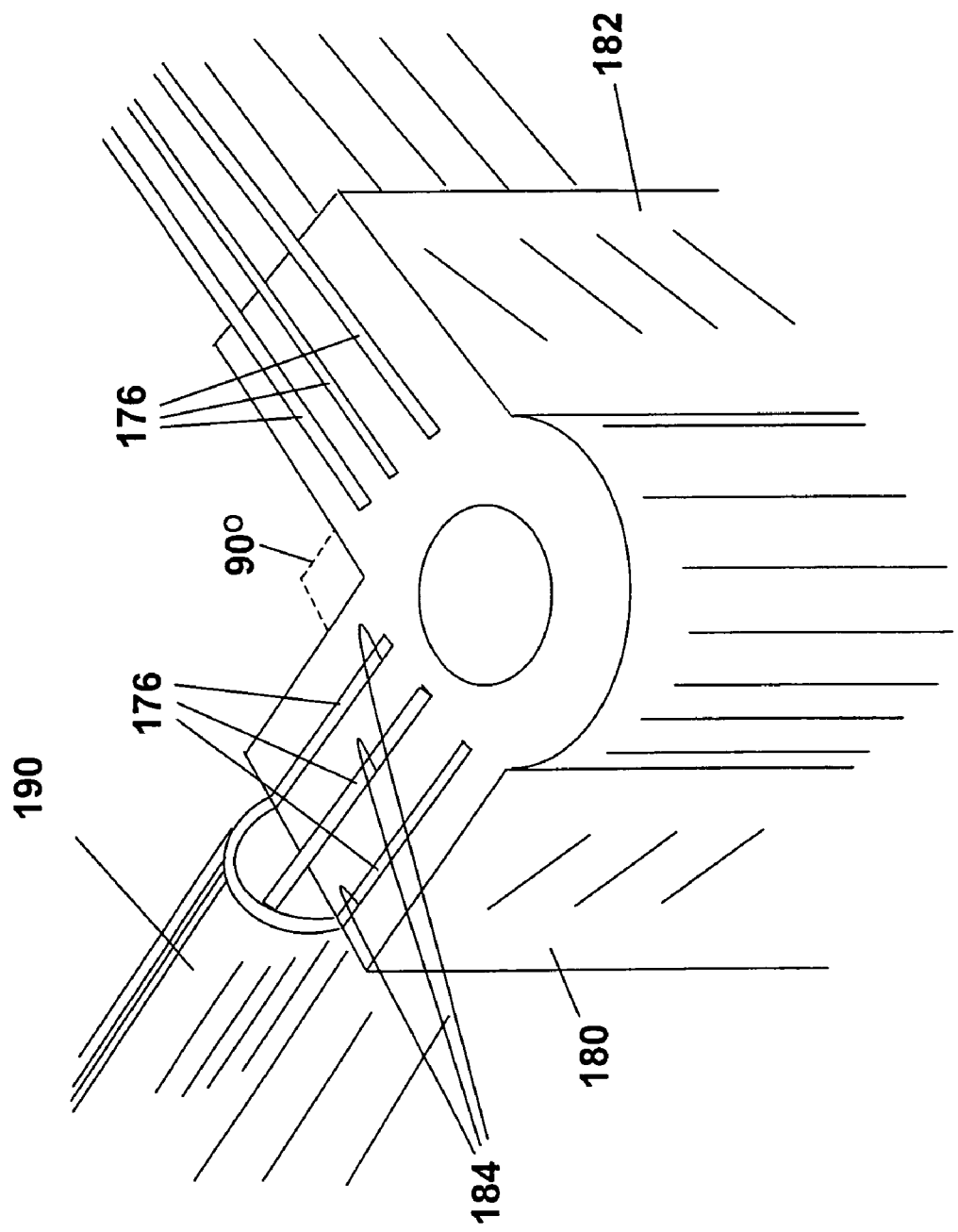

ION SOURCES FOR ION IMPLANTATION APPARATUS

CROSS-REFERENCE TO RELATED APPLICATION

This application is a continuation of application Ser. No. 10/334,136, filed Dec. 31, 2002 now U.S. Pat. No. 6,847,043, the priority of which is hereby claimed.

BACKGROUND OF THE INVENTION

Field of the Invention

This invention is concerned with improvements in or relating to ion sources particularly though not exclusively for use in or with ion implantation apparatus.

A typical ion source of the type with which the present invention is concerned comprises an ionisation, or arc, chamber (also sometimes referred to as a plasma chamber) into which source material can be introduced to generate a plasma in which the source material, or a component thereof, is ionised and the ions drawn off through an outlet from the chamber. One typical ionisation chamber has a pair of cathodes arranged in opposed relationship, one referred to as a cathode and the other as a counter cathode. In use, the cathode is heated and emits electrons. The counter cathode then repels the electrons so that they are entrained between the two electrodes. The chamber is typically within a magnetic field which causes the electrons to move in fixed paths (e.g. spiral) between the two electrodes. Ionisation of the source material is achieved by the application of energy to the source material in a number of different ways, e.g., by applying an arc potential between the cathode and the chamber body or by use of r.f. energy. Interaction of the electrons with the source material introduced into the chamber causes ionisation of the source material. An extraction electrode which is negatively biased relative to the chamber itself is mounted at the outlet from the chamber, typically outside the chamber. The negatively biased extraction electrode draws the ions through the outlet and the ions then pass through an aperture in the extraction electrode to the ion implantation apparatus proper.

The present invention has as its principal objective to improve the output of a required ion species of existing ion sources. The efficiency of an ion source is affected by, for example, the efficiency of the ionisation chamber itself, the elements within the chamber such as the electrodes and the output from the chamber, i.e. the quantity of ions emitted from the chamber.

SUMMARY OF THE INVENTION

We have found that the efficiency of the chamber itself can be significantly improved by retaining heat within the chamber body and thus within the chamber cavity. Accordingly, the present invention provides an ion source comprising an ionisation chamber within which a plasma can be generated, the chamber having an outlet through which ions can exit from the ionisation chamber, electrodes in the ionisation chamber for establishing and maintaining a plasma within the chamber when a power supply is provided thereto, and a heat shield enclosing at least a part of the ionisation chamber to retain heat within the chamber when the ion source is functioning.

There are various ways in which heat shields can be provided for the ionisation chamber. A heat shield can be provided by a simple coating of material on the exterior surfaces of the chamber, or by a plurality of such coatings. If one or more coatings is/are employed, then the single coating, or the innermost of a plurality (i.e. that applied directly to the exterior of the chamber) preferably has/have heat reflective properties, such that heat generated by the plasma within the chamber and conducted through the body of the chamber is retained in the chamber thereby causing the temperature of the chamber body to increase and thus also of the chamber interior. As a preferred alternative, or in addition to coating the exterior of the chamber, a plurality of heat shield members may at least partially surround the chamber so that the chamber is effectively clad in preformed heat-reflecting, and possibly heat-insulating material, most practically in the form of plates or panels of such material, either provided as single plates or panels which can be mounted on or around the chamber to enclose at least a part of the chamber, or by two or more plates or panels of heat-reflective material, such as stainless steel, with the plates or panels arranged in parallel, spaced apart, relationship to one another to define a gap between adjacent plates or panels (hereinafter referred to as 'plates' only).

Where the chamber is typically of cuboid shape, the plates would be rectangular to form an exterior heat shield for the chamber, with the plates extending in their spaced apart, parallel, relationship co-extensively with an adjacent wall of the chamber, the plates extending along one wall being coupled to plates extending along each adjacent wall by coupling members adjacent each corner edge of the chamber. The coupling members may each, in a preferred embodiment, be provided with wing portions defining elongate spaced wall portions, between adjacent ones of which a slot is defined. Each slot is of a width and length such that an edge portion of a plate can be located therein whereby, from one end of the plates where they are mounted in the slots of a wing portion of a coupling member, plates can extend in spaced parallel relationship to the next adjacent coupling member, while being also spaced from the adjacent wall of the chamber.

As a further alternative, the heat shield may be in the form of a hollow multipart body into which the ionisation chamber can be fitted. Such a structure can be assembled in the same manner as above described. As a yet further alternative, such a hollow multipart body may be of sufficient size to accommodate an insulating chamber having heat insulating and/or reflecting plates already provided thereon.

The coatings and/or external plates where these comprise reflective material may be formed to provide a reflective surface of metal, e.g. tungsten, molybdenum, nickel, tantalum, or of compounds thereof or of metallic alloys and/or compositions, but, as stated above, may be e.g. stainless steel provided that this does not affect beam purity.

Where a liner is contemplated for the chamber interior in order to enhance heat retention, the material selected therefor must be such that, when the chamber is in use, the material does not detrimentally contaminate the ion flow from the chamber. Suitable materials would be tungsten, molybdenum, graphite and silicon carbide and other materials provided that the melting points thereof are above that attained within the chamber when in use.

The present invention also provides an ion source comprising an ionisation chamber within which a plasma can be generated, an outlet through which ions can exit the chamber, electrode means in the ionisation chamber for establishing and maintaining a plasma within the chamber when a power supply is provided to the electrode means, and a screen provided on or adjacent an interior wall of the ionisation chamber, electrically insulated therefrom, the screen being heated during operation of the ion source to assist ejection of ions therefrom through said outlet and/or the breakdown of molecular species within the chamber. Heating may be either by passing an electrical current through it, or applying a bias to it so that it is heated by bombardment by the plasma constituents to help with the breakdown of molecular species within the source. Biasing the plate with respect to the chamber also assists the ejection of ions therefrom through said outlet.

It is preferred that the screen of an ion source according to the present invention is formed of metallic materials such as tungsten, molybdenum or compounds or alloys thereof. Alternatively, the material of the screen may be selected from materials which can contribute ions of the same species as are derivable from source material introduced into the chamber. The screen may be formed as a laminate of a layer of material capable of providing ions and a layer of low thermal conductivity material, with the latter facing the adjacent wall of the chamber.

The screen may be provided by a rectangular plate with the plate mounted on support pins which extend through the wall of the ionisation chamber. The plate may be supported on said support pins in spaced relationship to the wall of the ionisation chamber. When the source material is supplied in gaseous form and the chamber has an inlet port for introduction of such gaseous material, it is preferred that the screen overlies said inlet port to cause reactant gas or gases to disperse around it when flowing into the ionisation chamber.

One of said support pins is electrically conductive for coupling the screen to a variable bias supply for biasing the screen with respect to the chamber.

The screen within the chamber is maintained at a potential slightly more positive, or in some cases negative, than that of the chamber itself, which may be at ground or some other selected potential. The screen is designed so that, due to bombardment by constituents of a plasma in the chamber, it becomes heated.

It has been observed that, under such conditions, using a screen in the form of a tungsten plate (and where boron ions are to be produced from a source such as $BF_3$), there is a significant increase in B ion beam currents when the screen is biased positively relative to the chamber itself. A similar increase is observed for Ar ion beam currents when a gaseous Ar supply is used as the ion source feed material.

It is believed that the effect of increased ion beam current is due to modification of the plasma due to one or more of the electrostatic fields created in front of the screen, modification of the electron energy distribution within the plasma and/or the heated surface of the screen increasing the proportion of for example B ions as opposed to BF ions and $BF_2$ ions resulting from the initial $BF_3$ source material.

To enhance the efficiency of an ion source still further, it is important also to consider the efficiency of the cathode unit.

Accordingly, the present invention further provides in another aspect a cathode unit for use in an ion source of an ion implanter, wherein the ion source comprises an ionisation chamber incorporating said cathode unit, and an outlet through which ions can exit from the chamber, the cathode unit comprising a cathode tube arranged to extend through one of said opposed wall portions, a cathode button mounted at the end of the cathode tube within the chamber and a heater element positioned in the cathode tube for connection with a power supply negatively biasing the heating element (e.g. a filament) relative to the cathode button to emit electrons thereby to heat the cathode button to cause the cathode button to emit electrons into the ionisation chamber, the tube having a length and having at least one slit with a component transverse to the length such as to restrict heat conduction along the cathode tube.

In a preferred embodiment of this aspect of the present invention, a cathode unit may comprise two or more slits spaced along the length of the cathode tube, and/or two or more slits spaced around the cathode tube. Preferably, the slits are uniformly spaced around the tube. In one form of cathode unit according to the invention, each slit lies in a respective plane which is normal to the direction of the length of the cathode tube. A plurality of such slits can be arranged in a discontinuous ring around the tube, and ideally the ring is formed by between two and eight evenly-spaced slits, which may be of equal or substantially equal length, though it is not essential that this is so. Between adjacent slits of a ring of slits a neck portion is defined; the narrower the neck portion, the less heat can be conducted along the tube.

The provision of slits as compared with the prior art, in which much larger cut-outs were formed in the tube, provides the benefits and advantages of reducing gas loss and gas flow from the arc chamber and reduction of heat loss from the cathode.

In one embodiment of a cathode tube according to the present invention, the slits are formed in the cathode tube sufficiently closely and in such spaced relationship to one another as to define a tubular mesh.

When the ion source in which the cathode unit is mounted is in use and the cathode button is heated by bombardment of the cathode button by electrons from the filament, provision of the one or more slits formed in the cathode tube restricts heat conduction along the tube away from the cathode button. Consequently, the cathode button retains heat which would otherwise be dissipated along the tube. We have found that this has the effect of increasing ion beam current emanating from the ionisation chamber as compared with known cathode units of the same generic indirectly-heated cathode type. For example, an increase of about 15% has been measured for a low energy boron ion current. In consequence, it is possible, using a cathode unit according to the present invention, to operate an ion source more efficiently, with slightly less gas flow into the chamber to achieve the same ion current as before. Greater efficiency also reduces the rate at which insulators in the chamber (for mounting the electrodes for example) become coated with material condensing onto these elements as the time required to produce the same beam current as before is shortened. The cathode tube and the cathode button are typically formed of tungsten or molybdenum.

The cathode button may be shaped to provide a press fit with and at the end of the cathode tube, or may be integrally formed as a single one piece unit with the cathode tube. Where the tube and the cap are formed separately, the cap can be secured to the end of the tube by welds.

A cathode tube according to the present invention may be of any desired cross section but will preferably be of circular cross-section, most preferably of uniform circular cross-section.

An aperture may be formed in the body of the cathode tube for feeding and locating a filament and its attendant connecting wiring into the tube.

In another aspect, the present invention further provides a front face electrode for use as the front face of an ion source arc chamber, the front face electrode having an aperture through which ions can be extracted from the ionisation chamber when containing atoms of a predetermined species, and the electrode having an exposed surface containing further atoms of said predetermined species. The impregnated/coated material may also be placed in other parts of the arc chamber (e.g. as the shield previously described or as a side or end liner).

The front face electrode may be formed of a material, comprising, for example, graphite, impregnated with said atoms. By way of example, such atoms may comprise atoms of an element selected from the group consisting of boron or boron nitride, where boron ions are created within the chamber using a source such as $BF_3$. The front face electrode is generally of planar form and uniformly impregnated with said material.

The present invention further provides a front plate for an ionisation chamber for use in extracting boron ions from the ionisation chamber for supply to an ion implantation apparatus, the front plate being mountable to provide an outlet of the ionisation chamber through which boron ions are directed from the ionisation chamber, and being formed of a material comprising graphite or other material (e.g. tungsten) impregnated with a material selected from the group consisting of boron or boron nitride.

The present invention further provides a front face plate for use as the front face plate of an ion source arc chamber, the front face plate having an aperture through which ions can be extracted from the ionisation chamber when containing atoms of a predetermined species, and the plate having an exposed surface coated with a material which comprises an element or compound thereof, ions of which element or compound are of the same predetermined species as those in the ionisation chamber. The plate may again be formed of a material comprising graphite coated with a material selected from the group consisting of boron or boron nitride, where boron ions are created within the chamber using a source such as $BF_3$. Both faces of the plate may be coated with said material whereby the plate can be reversed when the coating on said one face is exhausted.

We have found that, with a front face plate, which may also be used as an extraction electrode, according to the present invention, wherein an electrode made of graphite and coated with boron carbide was used, a >10% increase in a 10 keV boron ion beam current was observed. It is believed that this is due to the plate being eroded during use of the chamber so that boron will enter the chamber and be ionised and the boron ions then extracted as part of the ion beam.

Although reference has only been made to use of a front face plate according to the invention being used to enhance boron ion creation and extraction, it will be readily appreciated that it is equally possible, within the scope of the present invention, to provide such plates, or extraction electrodes, coated or impregnated with other elements or compounds, according to the ions to be created in the ionisation chamber.

There now follows a detailed description of various aspects of the present invention, illustrated by way of example with reference to the accompanying drawings,

BRIEF DESCRIPTION OF THE DRAWINGS

FIG. 7 is an enlarged schematic perspective view of a portion of FIG. 6 enclosed by the circle A therein.

DETAILED DESCRIPTION OF THE PREFERRED EMBODIMENTS

Figure 1:
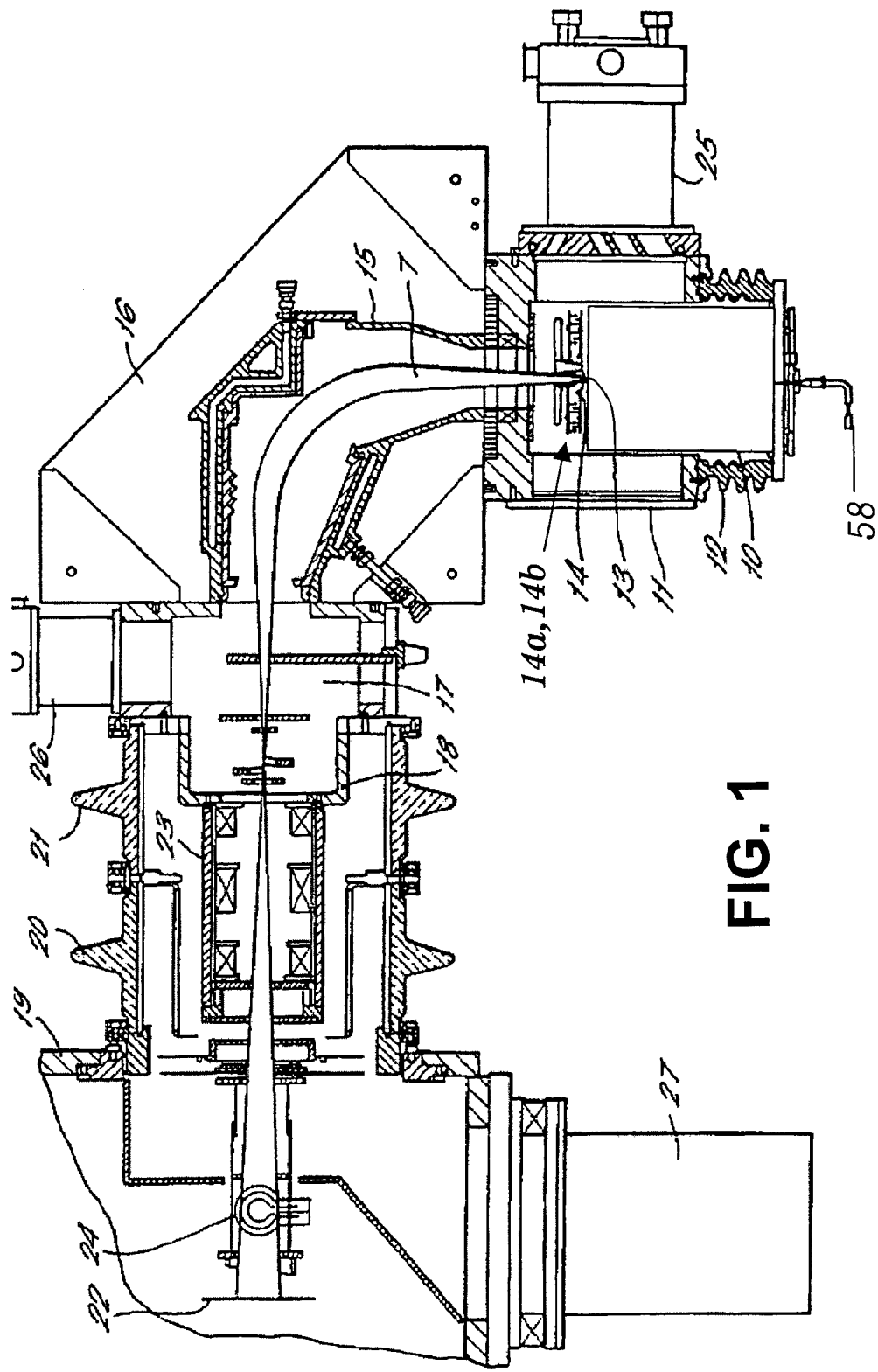
FIG. 1 is a generally diagrammatic view of an ion implanter apparatus according to the present invention incorporating an ion source according to the present invention.

Referring to FIG. 1, an implantation apparatus, including an ion source according to the present invention, is illustrated schematically therein. In the apparatus, ions for implanting into a substrate are generated in an ion source indicated generally by the block 10 and described below with reference to FIGS. 2 to 4. The ion source 10 comprises an ionisation chamber mounted on a housing 11 by means of an insulating bushing 12, so that the ion source can be biased relative to the housing to generate the required extraction potential to extract ions from the source and accelerate them to the required transport energy of the ion beam. Ions are extracted from the source through an outlet in the form of a slit 13 formed in a wall of the ionisation chamber and accelerated to the required transport energy by the potential difference between the slit and one or more extraction electrodes illustrated generally at 14.

The extraction electrodes illustrated generally at 14 in FIG. 1 are typically provided externally of the ionisation chamber 10. (Similar electrode arrangements are disclosed in our U.S. Pat. Nos. 5,883,391, 5,920,076 and 5,977,552 which are hereby incorporated herein by reference.)

In U.S. Pat. No. 5,920,076, there is disclosed a known extraction electrode structure which is typical of a structure that can be used with an ion source according to the present invention. In that structure, a pair of electrodes is spaced from the ion source, as represented generally at 14a, 14b in FIG. 1 of the accompanying drawings. The electrodes are also spaced and insulated from each other. Opposed apertures are formed in the electrodes in line with the slit 13 in the chamber of the ion source.

In generating an ion beam 7, the ion source is voltage biased positive (for the extraction of positive ions) relative to the extraction electrodes, and ions are extracted from the ion source, accelerate towards the electrodes and pass through the apertures therein. The electrode furthest from the ion source 10 is maintained at ground potential. An electrode is generally biased negative with respect to ground (in this embodiment the one closest to the ion source) and serves to prevent electrons which are present in the space forward of the extraction electrode pair, and are required to neutralize the ion beam, from sweeping back to the ion source.

The ion beam emanating from the ion source under the influence of the extraction electrode structure is tuned to the required energy and beam current by adjusting the voltage of the electrode 14b and the ion source and/or adjusting the size of the gap between the ion source and the electrode structure. The position of the electrodes relative to the ion source can also be adjusted to match the electrodes optically to the ion source.

Ions extracted from the ion source through the extraction electrodes 14a, 14b then pass from the ion source housing 11 into the flight tube 15 of an analysing magnet 16. In the analysing magnet 16, the ions in the beam 7 from the source travel through a region of strong magnetic field causing the ions to adopt flight paths having radii of curvature dependent on the mass/charge ratio of the individual ions.

Ions of a predetermined range of mass/charge ratios travel through the analysing magnet in curves to emerge substantially at right-angles to the original beam path, into a mass selecting region 17 of the implantation apparatus, the mass selecting region containing one or more slits to define precisely the mass/charge ratio selected by the apparatus for implanting into a substrate.

In the form of ion implantation apparatus illustrated, the ions may be extracted from the ion source 10 and accelerated to energies of about 10 keV-60 keV, and preferably 40 keV to 50 keV, though the energies may be either lower or higher than the range limits provided as example. The ions are retained at this energy throughout their passage through the analysing magnet 16 and the mass selection region 17. For this purpose, the flight tube 15 of the analysing magnet, the housing 18 of the mass selection region and the housing 11 are maintained at uniform potential. The ion source 10 is biased at the extraction potential, e.g. 40 keV or 50 keV relative to this flight tube ground potential, to generate the required extraction bias.

In a practical implantation apparatus, implantation energies of up to 200 keV or more may be required, so that it is necessary to accelerate the ions (still at a maximum 60 keV leaving the mass selection region 17) to the higher required implantation energy. For this purpose, housing 19, containing the semiconductor wafer to be implanted is insulated from the housing 18 by means of insulating bushings 20 and 21. Wafer 22 to be implanted is mounted on a holder in the housing 19, and the whole target region including housing 19 and wafer holder is held at ground potential. The housing 18 is then biased as required relative to the target housing 19 to provide the required post acceleration potential to accelerate the mass selected ions to the required implantation energy.

Immediately before the accelerated beam impinges upon the wafer 22, a plasma gun 24 floods the beam and the wafer with low energy electrons to neutralise any charge accumulation on the surface of the wafer due to implanted ions.

It will be appreciated that the entire beamline is maintained at very low pressure. Turbo pumps 25 and 26 are provided to evacuate the ion source and the mass selection region respectively. A further cryogenic pump 27 maintains the pressure in the target region as low as possible to minimise contamination. Although the described apparatus is capable of further accelerating the ions after mass selection by as much as 160 keV for implantation (or 190 keV for high energy implantation), the apparatus can also operate with lower implantation energies. Indeed, by biasing the beamline region (11, 15 & 18) in the opposite direction, the mass selected beam can be decelerated to below the ion source extraction energy.

The processing speed for wafers exposed to the beam of ions for implantation is dependent amongst other things on the beam current density of required ions impinging upon the wafer. Especially for low implantation energy applications, there are difficulties in maintaining the beam current of ions being implanted at satisfactory levels.

Figure 2:
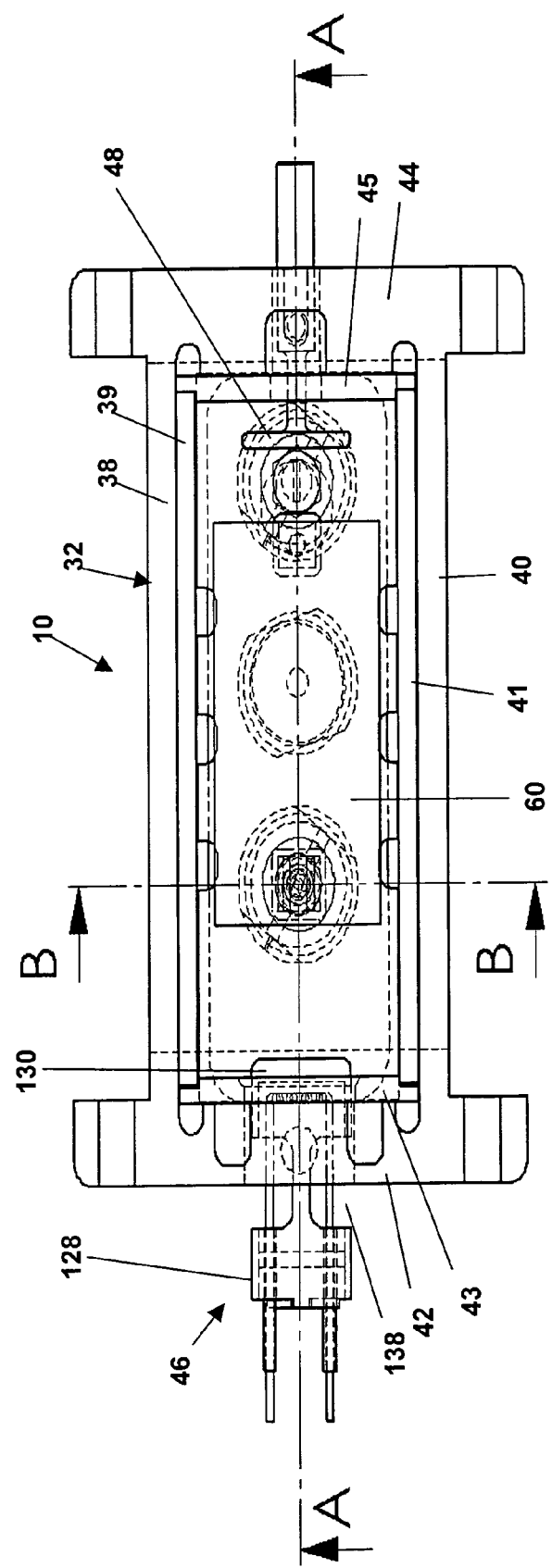
FIG. 2 is a plan view of an ion source according to the present invention.
Figure 3:
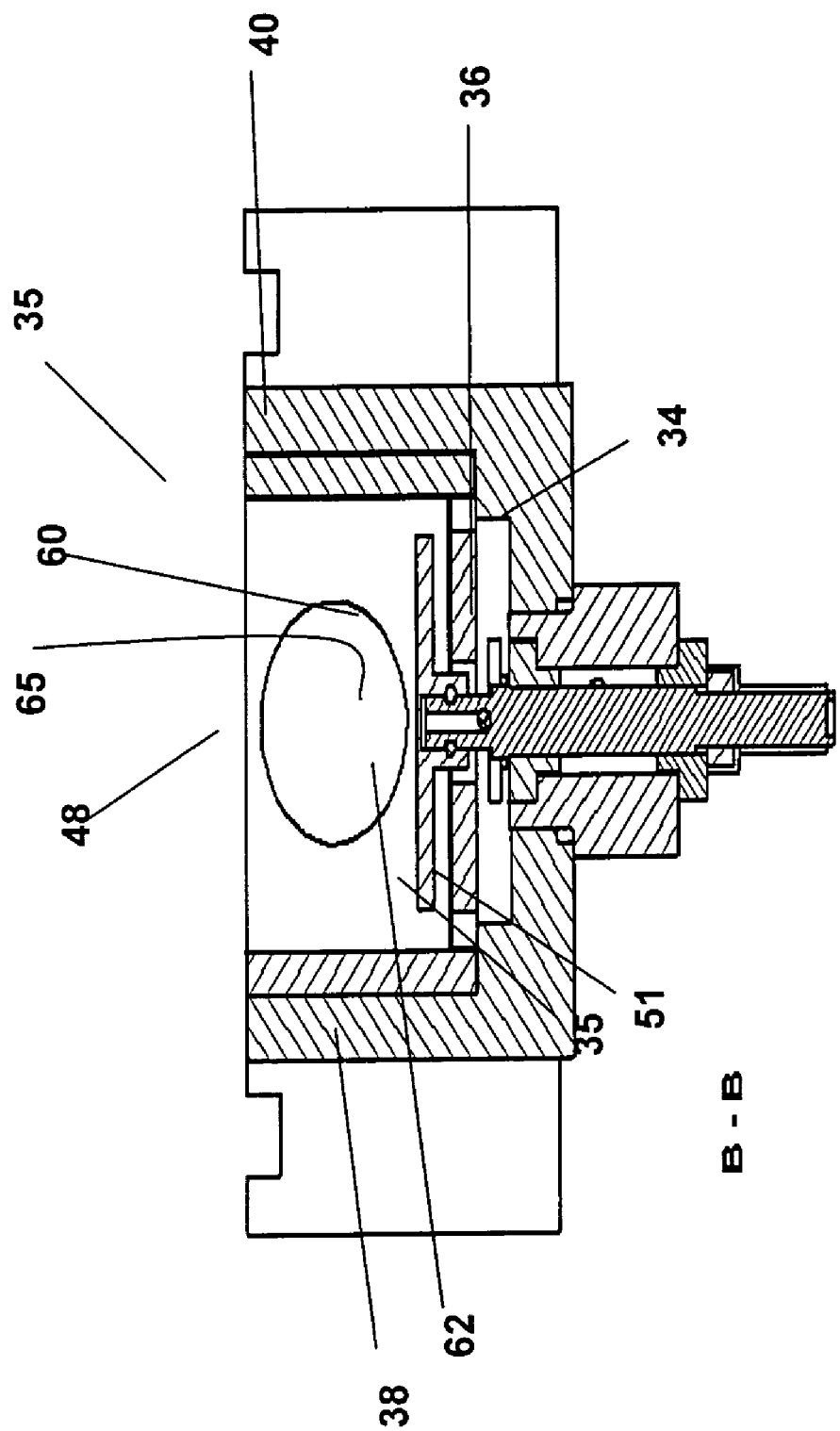
FIG. 3 is an end sectional view taken on the line B-B of the ionisation chamber shown in FIG. 2.
Figure 4:
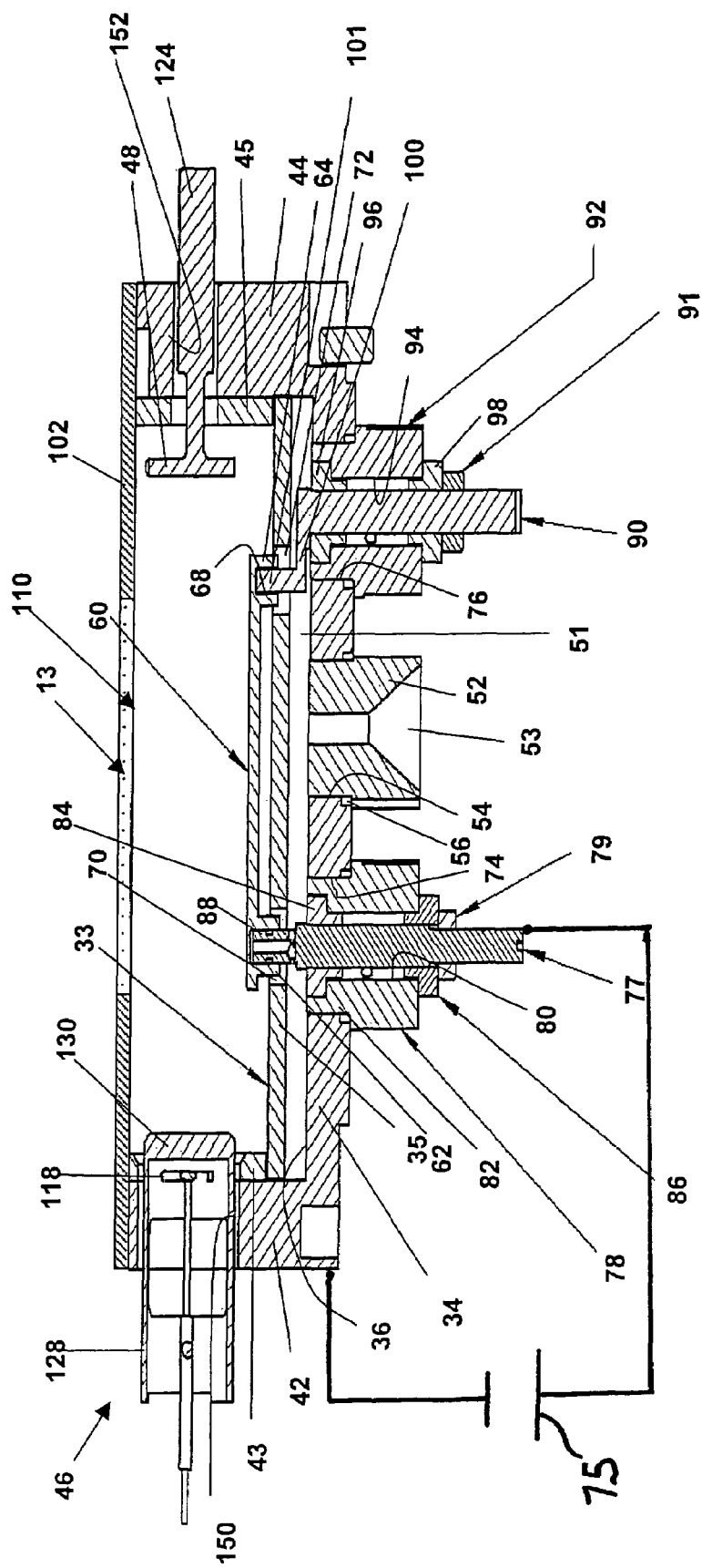
FIG. 4 is a sectional view, taken on the line A-A of the ionisation chamber shown in FIG. 2.

Referring now to FIGS. 2 to 4, there is shown an ion source according to the present invention for use with the implantation apparatus of FIG. 1 which can increase the proportion of the desired ions in the beam current extracted from the source, so that the residual beam current of the desired ions implanted in the wafer can also be increased. The associated extraction electrodes are omitted for clarity.

The ion source indicated generally at 10 (see also FIG. 1) comprises an ionisation chamber 32 which has a front plate electrode or top 102, base 34 defining a floor 36, side walls 38, 40 and end walls 42, 44, all of which are rectangular and form a cuboid structure collectively. Obviously other shapes may be used. The use of "top", "bottom", "base", "side" and "end" are used for convenience, and do not denote a desired or necessary orientation of the ion source in use. Within the chamber 32 is provided a liner 33 which may be formed as a single unitary box-like structure providing panels fitting in sliding relationship with the interior surfaces of the walls 38, 40, 42, 44 of the chamber 32 or may be formed as a plurality of liner panels 39, 41, 43, 45 which can be slotted into place, abutting those interior surfaces and inter-supporting as shown in FIG. 2. The liner panels are supported on a base liner panel 35 of the liner 33 which base liner panel is supported in spaced relationship from the floor 36 of the chamber to define a cavity 51 for the purpose hereinafter described when the source is positioned in space as shown in FIG. 4.

The end liner panels 43, 45 are each recessed to accommodate end portions of the side liner panels 39, 41. The four liner panels 39, 41, 43, 45 are seated on the base liner panel 35 as shown in FIG. 2.

In addition to the provision of a liner within the ionisation chamber, or as a preferred embodiment of the present invention, the ionisation chamber can be enclosed, wholly or partially, by a heat shield in order to retain heat within the chamber and thereby improve the efficiency of the ion source. Retention of heat together with the continued plasma generation causes an increase in temperature within the chamber, thereby increasing the effectiveness of the dissociation and ionisation of the source material, such as boron trifluoride ($BF_3$), to produce more boron ions.

Such a heat shield can be created by coating the exterior surfaces of the chamber with heat-reflective and/or heat-insulating material. For optimum results, where multiple coatings are applied, one or more heat reflective coatings or one or more heat-insulating coatings may be applied to the exterior surfaces, or these may be applied alternately until the desired level of heat shielding has been built up.

In addition, or as a preferred alternative to the provision of coatings, heat shielding can also be provided by plates of heat-reflective and/or heat insulating material to enclose all or part of the chamber. The heat shield can be preformed of box-like structure to enclose the chamber.

Figure 6:
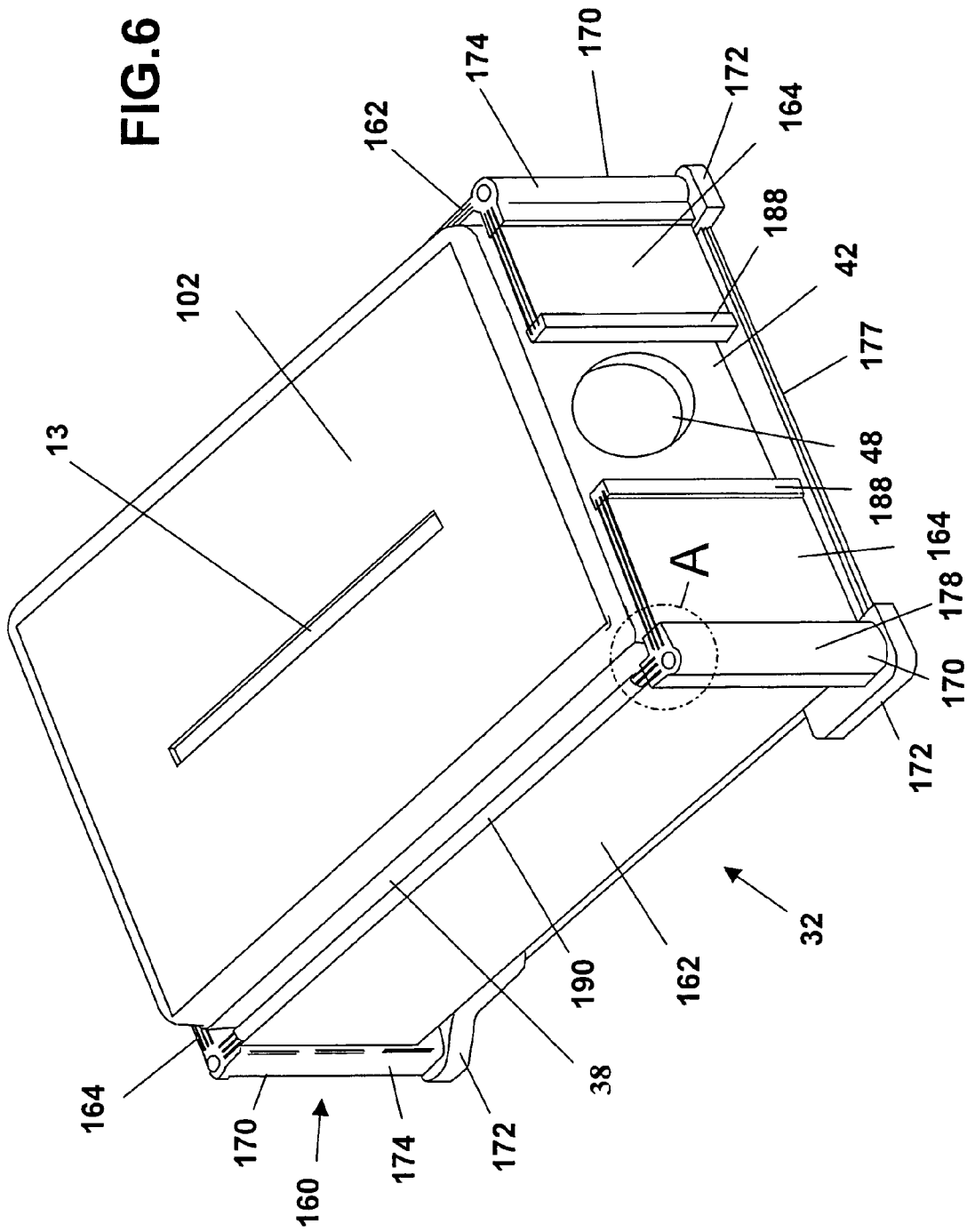
FIG. 6 is a perspective view of an ion source according to the present invention.

A preferred embodiment of ionisation chamber having a heat shield provided thereon is shown in FIGS. 6 and 7. The same reference numerals are used in these Figures as are used in FIGS. 2 and 4, where appropriate, to identify like parts of the chamber as are illustrated therein.

The ionisation chamber 32 has a front plate 102 and is at the same potential as the arc chamber and is surrounded by a heat shield generally indicated at 160. The heat shield 160 comprises side shield member 162 and end shield members 164. The shield members are held in position to surround the side and end walls 38, 40 and 42, 44 respectively of the chamber 32 (40, 44 not shown in FIGS. 6 and 7) and are spaced therefrom. The means for holding the members 162, 164 in position comprise four coupling members in the form of corner pillars 170 each of which has a base portion 172 and an upright pillar portion 174.

Each shield member 162, 164 comprises three plates 176 of heat-reflective material (shown in FIG. 7). Each plate is formed of heat-reflective material which may be stainless steel, typically of thickness in the range of 0.25-100 mm thickness though other thicknesses may be selected according to requirements. The three plates of each shield member are mounted in spaced-apart relationship so that a gap exists between the centre plate and each of the other two plates. Thus, in the operating environment of the ionisation chamber 32 where it is located within the vacuum environment of an ion implanter, each of the three plates of each member 162, 164 reflects radiated heat which may emanate from the walls of the ionisation chamber. A base shield member 177 (similarly constructed to shield members 162) is also mounted adjacent but spaced from the base 34 of the ionisation chamber, in a similar manner to that hereinafter described with reference to the side and end members 162, 164.

As shown in FIG. 7, each pillar portion 174 of each corner pillar 170 comprises a hollow columnar portion 178 and two wing portions 180, 182, all of which are orthogonal to the base portion 172. The wing portions 180, 182 are at right angles to one another when viewed in plan. Each wing portion 180, 182 of each corner pillar 170 has three vertical spaced-apart, parallel slots 184 formed therein, each slot being of a width such that it can accommodate a vertical end portion of one of the plates 176. The plates may be frictionally fitted within their respective slots or may fit more loosely therein provided that between any two adjacent pillars 170, they are maintained in spaced-apart relationship. Each wing portion 180, 182 has two vertically-spaced threaded apertures (not shown) which, when the plates are marked in their respective slots, are aligned with corresponding apertures in the vertical end portions of the plates so that bolts may pass therethrough to secure the plates in position.

The end walls 42, 44 have the cathode unit 46 and the second electrode ("counter cathode") 48 extending therethrough and to accommodate these, the end heat shield members 164 are formed in two parts, as shown in FIG. 6 where both parts extend across the end wall 42 up to but not to an extent that they would touch the mounting for the cathode unit 46 or the unit itself. The plates 176 of these heat shield members 164 are held in spaced-apart relationship at their vertical end portions adjacent the cathode unit mounting by vertical bars 188 which are formed with spaced parallel vertical slots into which the plates can be fitted and secured by bolts in the same manner as in the wing portions 180, 182 of the corner pillars 170.

Each shield member 162, is capped by a length of rolled over shielding to avoid electrical breakdown from the edges of the individual plates.

Though, in the embodiment of FIGS. 6 and 7, the shield members are disclosed as comprising three spaced-apart plates, it is to be clearly understood that, depending upon the environment and operating conditions in which the ionisation chamber is used, and the temperatures attained within the chamber, it is foreseen that less than three or more than three plates may be employed in each shield member 162, 164. To accommodate more than three plates, each wing portion 180, 182, may be provided with more than three slots, and the number and spacing of the plates may be adjusted according to requirements, as may the thickness of the individual plates.

We have found that, when generating boron ions within the chamber from a boron fluoride source material, placing shielding around the ionisation chamber produced a significant effect upon the yield of boron ions in a 2 KeV boron current. Provision of a single-layer heat shield of heat-reflective material round the chamber produced a current increase of about 10%, while augmenting of the heat shield by using a triple-layer construction resulted in a >15% increase in beam current. In both cases, the heat reflective material was polished stainless steel.

As shown in FIGS. 2 to 4, a gas supply for providing an ionisable gas, e.g. $BF_3$, to the ionisation chamber, as the source of ions to be delivered ultimately to the wafer 22, is coupled to the ionisation chamber 32 through tie base 34. A connection to the gas supply is illustrated in FIGS. 2 and 4 and comprises a manifold 52 seated in an aperture 54 therefore provided in the base 34. The manifold 52 provides an inlet 53 for gaseous source material and is sealed in position by an O-ring (not shown) which is located in an annular seat 56. In use the manifold 52 couples to a gas supply via a gas supply conduit 58 shown in FIG. 1.

In addition to $BF_3$ as a gaseous source material, arsine and phosphine may also be used, for example, if arsenic ions or phosphorous ions are required. Other source materials include $GeF_4$ and $SiF_4$ where Ge and Si ions are required. Of course, other gaseous source materials, such and $H_2$ $CO_2$ and $N_2$ may also be used. Furthermore, solid source materials may be employed in the ion source in powder or particulate form or in the form of a solid body. For such purpose the ionization chamber is not required to have an inlet for admitting source gas but may be connected to a vaporizer.

Mounted within the chamber in close spaced relationship to the base panel 35 is a screen provided by a rectangular plate 60 which is made of metal or metal laminate or is clad with metal foil to provide an electrode which, in use, may be biased relative to the chamber.

The screen is made of a material (e.g. tungsten plate) having poor thermal conductivity (for tungsten 174 $Wm^{-1}C^{-1}$) so that in the presence of a plasma, it is heated due to bombardment by the various plasma constituents. The screen is mounted within the chamber in electrical isolation from the chamber body and the electrodes extending into the chamber. With a positive bias being applied to the screen we have observed a significant increase in both argon and boron beam currents when argon and boron trifluoride are supplied to the chamber. It is believed that the presence of the heated, positively-biased screen improves the breakdown of the source material to increase the yield of desired ions. This can be attributed to a number of causes, namely that the plasma itself is modified due to the electrostatic field associated with the positively-biased screen, modification of the electron energy distribution within the plasma, and the heated surface of the screen itself, leading to the improved breakdown of the source material.

Of course, the screen may itself be formed of a material capable of augmenting the ion beam current or it may be formed of a material which is impregnated and/or coated with it.

The plate 60 is formed, on the face of the plate facing the base panel 35, with two bosses 62, 64, one adjacent each end of the plate, and having cylindrical recesses 66, 68 respectively formed therein. The bosses 62, 64 seat within apertures 70, 72 respectively formed in the base panel 35. The apertures 70, 72 are of larger diameter than the bosses 62, 64 so that neither boss is in contact with the base panel 35.

Apertures 74, 76, corresponding to the apertures 70, 72 respectively, are formed in the base 34 and through the aligned apertures 70, 74 extends a conductive cylindrical pin 77 providing a connector to a power supply 75 to provide a potential bias to the plate 60. The pin 77 is mounted in a bush 78 having an internal bore 80 of greater internal diameter than the diameter of the pin 77. The bush has a reduced diameter portion 82 which seats within the aperture 74. The pin 77 is held within the bore 80 by insulating spacers 84, 86 and has a head portion 88 which fits within the recess in the boss 62 of the plate 60.

A cylindrical support pin 90 extends through aperture 76, mounted in a bush 92 having an internal bore 94 of greater internal diameter than that of the pin 90. The pin 90 is held within the bore 94 by spacers 96, 98 and has a stepped crank portion 100 providing a boss 101 which extends through the aperture 72 into the recess in the boss 64 of the plate 60. The two pins 77 and 90 support the plate 60 in spaced relationship to the base liner panel 35.

The relative spacing of the base 34, the base liner panel 35, and the electrode plate 60, permit reactant gas to flow though the manifold 52 into the cavity 51 and through cutouts in the base plate 35 and around the edges of the plate 60 to disperse into the interior of the chamber 32.

In FIG. 4 the ionisation chamber is shown as having the top plate 102 attached to the ionisation chamber 32. The plate 102 is the first electrode of the extraction system, though it is at the same potential as the chamber. A liner panel may be secured to the interior surface of the face plate electrode though this is optional.

Extending through the plate 102, there is the outlet 13 in the form an elongate slot through which ions can exit from the ionisation chamber. An extraction electrode 14a is maintained at a potential such as to draw ions from the plasma created inside the chamber when the chamber is operating.

The front plate 102 which may be formed from more than one piece of material is in the shape of a rectangular plate which is formed of graphite. The graphite can be either impregnated and/or coated with a material capable or providing the same ions as are provided by the plasma within the chamber. Thus, for example, if a source gas such as boron trifluoride is introduced into the chamber for the purpose of providing a supply of boron ions, then the electrode is either impregnated or coated with boron, boron nitride or boron carbide so that as the electrode is bombarded and heated during operation of the ion source, boron ions are emitted and augment the ion beam emanating from the ionisation chamber.

Of course, the plate 102 may be formed of other materials and impregnated or coated with further materials capable of augmenting or complementing ions exiting through the outlet 13. As an alternative, in order to augment an ion beam, the plate may simply be formed of an ion-providing material. Thus, for example, if the source material in the ionisation chamber provides, say, aluminium ions, then the plate may be formed of pure aluminium. As a further alternative, the liner panel may be coated or impregnated with ion-providing material.

The ion source shown in FIGS. 2 to 4 also comprises an electrode structure comprising a prior art cathode unit 46 and an opposed counter cathode 48 mounted in opposed end walls 42, 44 of the chamber 10. The counter cathode 48 is mounted on an electrically-conductive post 124 which extends through the thickness of, and in electrical isolation from, the liner panel 45 and the end wall 44 of the chamber and is connectable to a negatively-biased power supply (not shown) at the same potential as the cathode unit 46. It can also be run at a different potential to that of the cathode.

The cathode unit 46 (FIGS. 5A to 5C) according to the present invention comprises a cathode tube 128 which is of cylindrical shape. The external diameter of a typical cathode tube is about 10-20 mm with length about 20-40 mm, the thickness of the tube wall being approximately 0.5-3 mm. The tube is typically formed of tungsten or molybdenum and may be finished by grit blasting with white fused alumina abrasive or in some other manner.

The cathode tube 128 carries a cathode button 130 (shown in FIG. 5C) which forms a press fit on the end of the tube and is positioned inside the chamber 32 when the cathode unit is mounted in position as shown in FIGS. 2 to 4.

The cathode button 130 is seated at the end of the tube and has a cylindrical seating portion 132 which can be pressed into the end of the cathode tube 128. The cathode button is also made of tungsten or molybdenum, but could of course be made from any suitable material used in the art of electron emission and may be welded to the tube.

Positioned within the tube 128 is a filament 118 of well known design and made of tungsten. The filament 118 is placed inside the tube close to the cathode button 130 and is connected to a heater power supply (not shown). When the ion source is in use, heating of the filament causes emission of electrons therefrom and these electrons impact the cathode button and cause emission of electrons therefrom into the ionisation chamber interior. A potential is applied between the filament and cathode to enhance the heating from electron impact.

The filament 118 is connected by leads (not shown) in conventional manner to a power supply for heating the filament.

In FIGS. 2 and 4 the tube 128 has apertures 138. The purpose of the apertures 138 in the wall of the tube is to permit the filament to be readily inserted inside the tube and to be readily removed therefrom when it is exhausted.

Figure 5A:
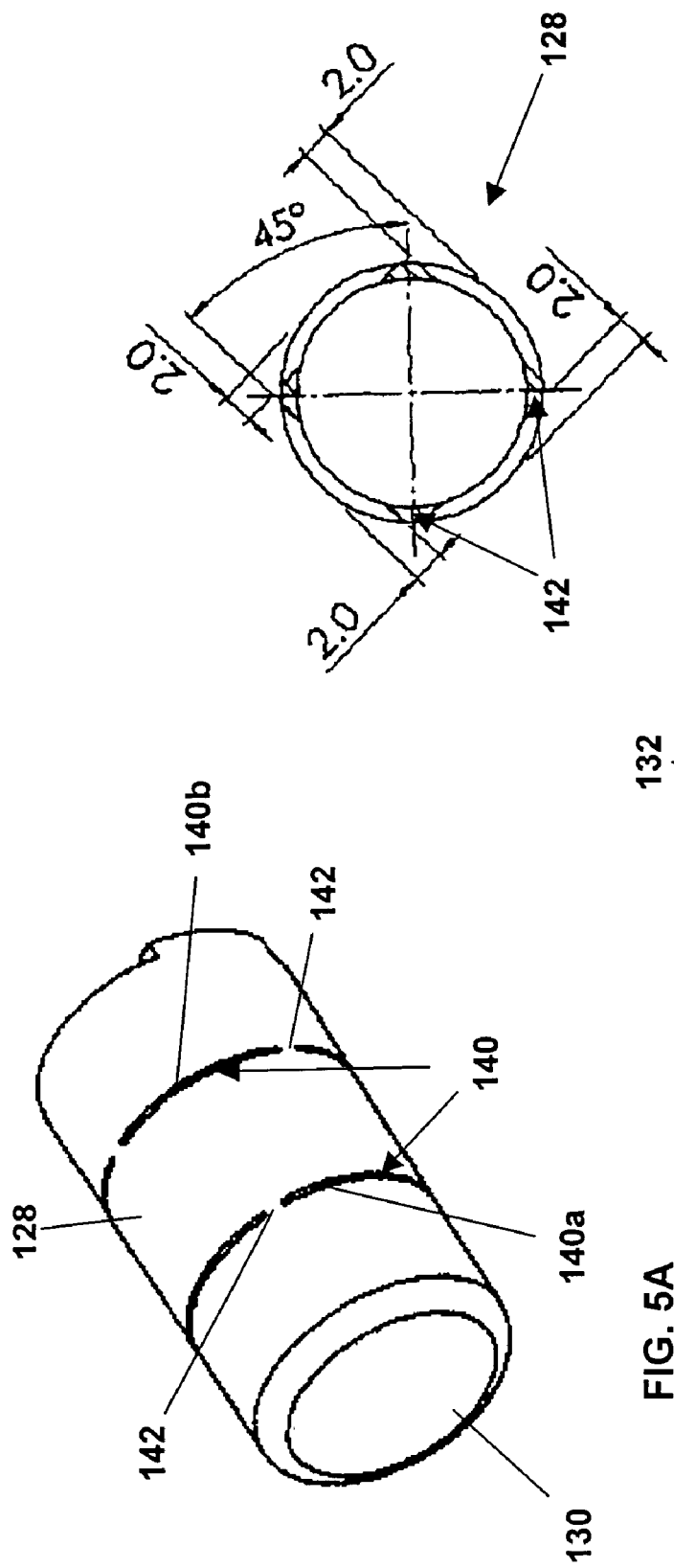
FIGS. 5A to 5C are views of parts of an electron source cathode unit according to the invention for an ion source according to the present invention.
Figure 5B:
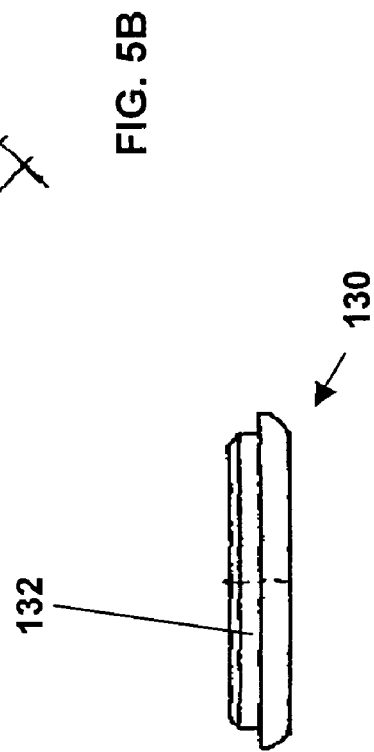
Figure 5C:
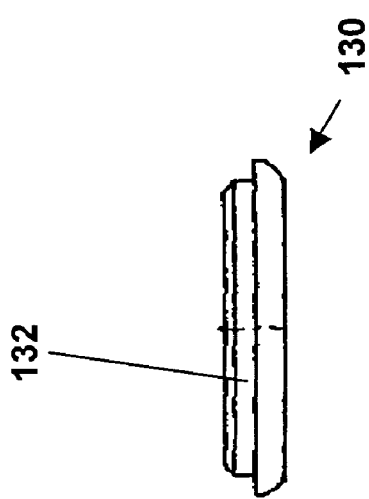

Spaced along the length of the tube in the embodiment of FIGS. 5A-5C, are formed slits 140. In FIGS. 5A-5C, eight slits 140 are shown, arranged as two sets 140a, 140b of four slits each, each set being arranged in a plane normal to the axis of the cathode tube 128 and spaced equidistantly about the circumference of the tube, leaving a bridge portion 142 of the tube between adjacent slits, each bridge portion having a circumferential width of about a few mm (e.g. 2 mm). Each slit 140 has an axial dimension (i.e. width) of about 0.2-0.8 mm, although these may of course be of other dimensions. We have found that provision of two sets of slits significantly reduces heat conduction along the tube when the cathode is in use and becomes heated, both by the emission of electrons from the filament, and by bombardment from ions in the plasma contained by the arc chamber, during operation of the ion source of which the cathode unit forms part.

Although the cathode tube shown in FIGS. 5A to 5C has eight slits, it will be appreciated that the effect of reduction of conduction of heat along the cathode tube can be achieved with single slit configurations or with more slits in various arrangements. Ultimately, there can be enough slits as to create a mesh so that the tube itself can have a mesh-like appearance. It will also be appreciated that the slits may extend diagonally around the tube.

Thus, either an increased ion current can be achieved or complimentarily the same ion beam current can be achieved as before but with a lower rate of gas flow into the chamber. Furthermore, with the tube being less open due to the absence of the large cut-out section provided by apertures 138, gas flow out of the arc chamber and also the possibility of a plasma developing in the tube is reduced.

The cathode tube 128 extends through an aperture 150 in the end wall 42 which is of a diameter such that the tube is not in contact with the end wall and is thus insulated therefrom. As previously stated, in use the cathode tube 128 may be connected to the same negative supply as the counter cathode 48, such that electrons which are discharged by the cathode unit 46 into the ionisation chamber are repelled by the counter cathode 48, and thus reciprocate between the two electrodes 46, 48. Mounted within or about the housing 11 and surrounding the ionisation chamber 32 is an arrangement of electromagnets which create a magnetic field within the chamber to entrain the electrons to move in fixed paths between the two electrodes 46, 48 to interact with the source material supplied via the gas supply conduit 53 to produce ions within the chamber. The post 124 on which the counter electrode 48 is mounted extends through an aperture 152 in end wall 44.

It will be appreciated from the foregoing description that the various aspects and features of the invention can be implemented independently of one another in an ion source according to the present invention and that these various aspects and features of the invention are capable of combination within an ion source, in accordance with the present invention.

The invention claimed is:

1. A cathode unit for use in an indirectly heated cathode in an ion source of an ion implanter, the cathode unit comprising a tube which is cylindrical having an axis and has a uniform external diameter of between 10 and 20 mm, a button member on one end of the tube and arranged to be indirectly heated, in use, for thermionic emission of electrons by electron impact from a biased heater element located, in use, within the tube behind the button member, said tube having at least one slit with a component transverse to the axis such as to restrict heat conduction along the tube.

2. A cathode unit according to claim 1 and having at least two slits spaced along the length of said tube.

3. A cathode unit according to claim 1 and having at least two slits spaced around said tube.

4. A cathode unit according to claim 3 wherein the slits are uniformly spaced around the tube.

5. A cathode unit according to claim 3 wherein each slit lies in a respective plane which is normal to the direction of the length of said tube.

6. A cathode unit according to claim 1 wherein a plurality of said slits is arranged in a discontinuous ring around the tube.

7. A cathode unit according to claim 6 wherein the ring is formed by between two and eight evenly spaced slits.

8. A cathode unit according to claim 4 wherein the slits are of substantially equal length.

9. A cathode unit according to claim 6 wherein a neck portion of the cathode tube is retained between adjacent slits of a ring of slits.

10. A cathode unit according to claim 7 wherein the slits are formed in said tube sufficiently closely and in such spaced relationship to one another that said tube defines a tubular mesh.

11. A cathode unit according to claim 1 wherein said tube and said button member are formed of a material selected from the group consisting of tungsten and molybdenum.

12. A cathode unit according to claim 1 wherein said button member is shaped to provide a press fit with and at the end of said tube.

13. A cathode unit according to claim 1 wherein said tube and said button member are integrally formed as a single one piece unit.

14. A cathode unit according to claim 1 wherein said tube is of circular cross section.

15. A cathode unit according to claim 1 wherein an aperture is formed in the body of said tube for locating a heating element within said tube adjacent said button member and for withdrawing a spent said heating element.

* * * * *